Figure 1:
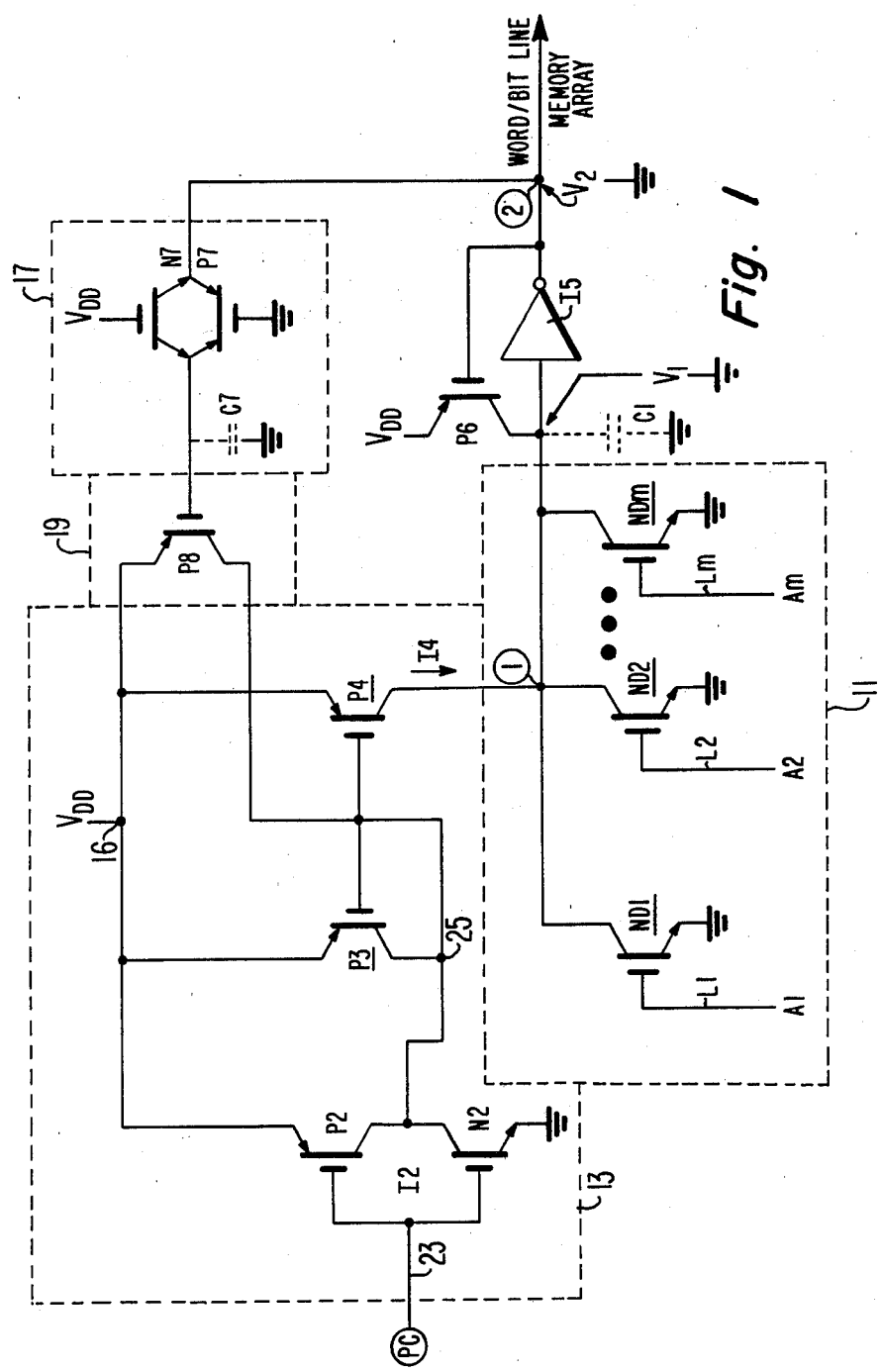

United States Patent [19]

Stewart

[11] 4,398,102

[45] Aug. 9, 1983

[54] GATED PARALLEL DECODER

[75] Inventor: Roger G. Stewart, Neshanic Station, N.J.

[73] Assignee: RCA Corporation, New York, N.Y.

[21] Appl. No.: 232,302

[22] Filed: Feb. 6, 1981

[51] Int. Cl.³ ............... H03K 19/017; H03K 19/094; G11C 8/00

[52] U.S. Cl. ................................. 307/449; 307/562; 307/575; 307/603; 365/230

[58] Field of Search ............ 307/449, 463, 246, 562, 307/573, 575, 580, 583, 584, 597, 601, 603, 605; 365/203, 230

[56] References Cited

U.S. PATENT DOCUMENTS 3,959,782  5/1976  Dunn .......................... 307/246 X
3,976,892  8/1976  Buchanan ..................... 307/449 X

OTHER PUBLICATIONS

Huffman et al., "Memory Address Decode Circuit", IBM Tech. Disc. Bull., vol. 19, No. 1, pp. 28–29, Jun. 1976.

Primary Examiner—Larry N. Anagnos
Assistant Examiner—David R. Hudspeth
Attorney, Agent, or Firm—Joseph S. Tripoli; Henry I. Schanzer

[57] ABSTRACT

The decoder includes a plurality of input signal responsive transistors having their conduction paths connected in parallel between a node and a point of reference potential. These transistors, when turned-on, tend to clamp the node to the reference potential. A controllable load is connected between a second voltage and the node for, when enabled and in the absence of an inhibit signal, providing a conduction path charging the node towards the second voltage. An inhibit network responsive to the node voltage inhibits conduction via the charging conduction path of the load when the node voltage is at, or close to, the second voltage. An external control signal applied to the controllable load can enable it in the absence of the inhibit signal.

9 Claims, 2 Drawing Figures

GATED PARALLEL DECODER

This invention relates to decoding circuitry and, in particular, to decoding gates whose outputs can switch between different levels very quickly.

Decoding gates may be used in many different applications to sense the coincidence, or lack thereof, of a plurality of input signals. For example, in semiconductor memories input signals (i.e. address inputs) are applied to decoding gates each of which has a unique output for a different combination of the address inputs. The output of each decoding gate is applied to its corresponding word or bit line in a memory array. When all the address inputs to a decoding gate represent the same binary value (e.g. all low, that is, all representing zero) the output of the decoding gate assumes one binary condition (e.g. high representing a "1") and its corresponding word or bit line is "enabled" or "selected". Then, the memory cells associated with the selected word or bit line will have information written into them or read from them depending on whether the memory is in a write or read mode. When one or more of the address inputs to the decoding gate represents the other binary value (e.g. a high, representing a "1") the output of the decoding gate assumes the other binary condition (e.g. low) and its corresponding word or bit line is "deselected" (i.e. not selected). Then, the memory cells associated with that word or bit line should not be written into or read-out, to prevent the writing of information into the wrong memory cells or the read-out of information from the wrong cells. Therefore, it is important that the output of a decoding gate switch quickly from a selected condition to a deselected condition, or vice-versa, from a deselected condition to a selected condition.

A known decoding gate includes a plurality of address input responsive transistors having their conduction paths connected in parallel between an output line and a first (low) point of potential. When an address input transistor is turned-on it tends to clamp the output line to ground. A normally off load transistor, connected between the output line and a second (high) point of potential, is turned-on by a precharge pulse whenever the addresses change state to provide a charging path to the "high" potential. If all the address input transistors are turned-off the output line can rise to the "high" potential.

This decoding gate has many advantages but suffers from at least the following two problems:

1. When the load transistor is turned-on and the parallel address input transistors change from a condition where none of them is on to a new condition where one or more of them is on, the turn on of the load transistor and the current it supplies slows the transition of the output line from the high level to the low level. The severity of this problem can be reduced by making the ON impedance of the load transistor relatively high. However, that leads to the second problem.

2. The load transistor has a relatively high ON impedance in order to be able to switch the output line from high to low. This results in slowing the response of the gate when the address input transistors are all turned-off and the load transistor has to pull the output line from the low level to the high level. The load transistor impedance must be designed to meet two contradictory conditions; neither one of which can be fully satisfied.

These problems are either overcome or reduced in circuits embodying the invention. Such a circuit includes a plurality of input signal responsive transistors having their conduction paths connected in parallel between an output line and a first point of potential. The signal responsive transistors, when turned-on, tend to clamp the output line to the potential at the first point. A controllable load means is connected between the output line and a second point of potential. The load is responsive to a control signal for providing a charging path between the output line and the potential at the second point, when not inhibited. The load is inhibited when the voltage on the output line is approximately equal to the voltage at the second point, whereby the output line can be quickly driven to the first point of potential.

Figure 2:
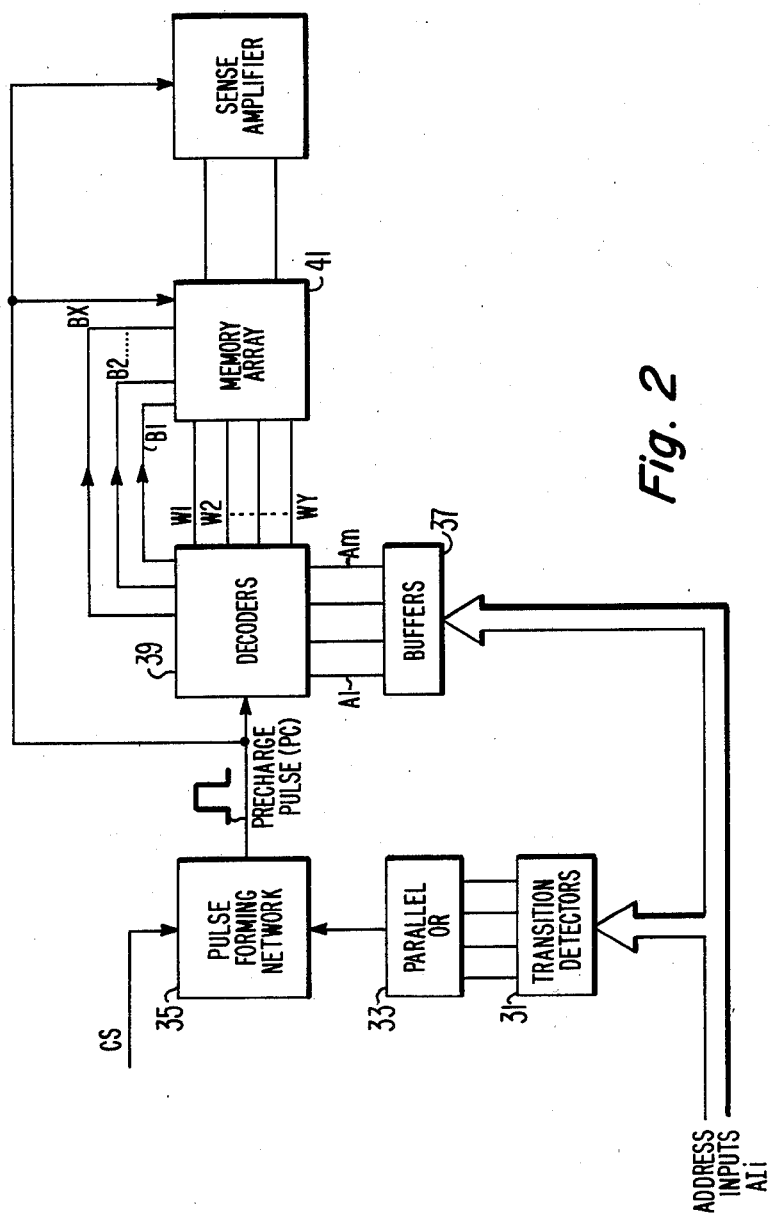

In the accompanying drawing like reference characters denote like components; and FIG. 1 is a schematic diagram of a circuit embodying the invention; and FIG. 2 is a block diagram of a memory system embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. The reader is referred, for example, to column 2 of U.S. Pat. Nos. 4,037,114 and 4,001,606 which are incorporated herein by reference.

In the discussion to follow, a potential at, or near, ground is arbitrarily defined as a logic "0" or "low" condition, and any potential at or near $+V_{DD}$ volts is arbitrarily defined as logic "1" or "high" condition.

The circuit of FIG. 1 includes a parallel decoder network 11 responsive to address inputs Ai, a current sourcing circuit 13, a buffer 15, a delay network 17 and a clamp 19.

The parallel decoder 11 is comprised of transistors NDi, where $1 \leq i \leq m$, having their conduction paths connected in parallel between a node 1 which functions as a summing node and ground potential. The gate electrodes of each NDi transistor is connected to its respective address line Li to which is applied a respective address signal Ai. When all the Ai inputs are "low", none of the NDi transistors is turned-on (and node 1 can then be charged towards $V_{DD}$ volts). In the discussion to follow this is defined as the "selected" condition of the decoder gate and for this condition it will be shown that the voltage V1 on node 1 is driven to, or close to, $V_{DD}$ volts or "high". When one or more of the Ai inputs is "high", one or more of the NDi transistors is turned-on and node 1 will be pulled close to ground potential or "low". In the discussion to follow, this is defined as the "deselect" condition of the decoder gate.

Current sourcing circuit 13 is comprised of a complementary inverter I2 and transistors P3 and P4. Inverter I2 includes transistors P2 and N2 having their gate electrodes (which define the inverter input) connected in common to input control line 23 to which is applied a precharge (PC) pulse which functions as a control signal. The drains of P2 and N2, which define the output of I2, are connected in common to a node 25, the source of P2 is connected to line 16; and the source of N2 is returned to ground potential. The output of I2 is connected to the gate and drain of P3 and to the gate of P4. The source electrodes of P3 and P4 are connected to line 16 to which is applied $V_{DD}$ volts, and the drain of P4 is connected to node 1. In response to a "high" precharge pulse and in the absence of an inhibit signal, P4 supplies a relatively constant current into node 1. When a high precharge (PC) pulse is present at node 23, P2 is turned-off and N2 is turned-on. If inhibiting transistor P8 is turned-off, the current (I2) through N2 is equal to the current (I3) in the source-to-drain path of P3. The current (I3) through P3 causes a certain potential ($V_{GS}$) to be developed between the gate and source of P3 which is applied between the gate and source of P4. A relatively constant current I4, proportional to I2, then flows through the source-to-drain path of P4 into node 1. Thus, whenever PC is high and the inhibiting transistor P8 is off, a relatively constant current I4 is supplied to node 1.

Node 1 is connected to the input of an inverter I5 which may be a complementary inverter of the same type as inverter I2. The output of inverter I5 is connected to a node 2 which, in turn, is connected directly or indirectly to a word or a bit line of a memory array. A transistor P6 is connected at its gate to the output of inverter I5 and its source-to-drain path is connected between $V_{DD}$ and the input of inverter I5. P6 is a small device having a very high ON impedance.

The output of inverter I5 is applied via delay network 17 to clamp circuit 19. Delay network 17 includes transistors N7 and P7 having their conduction paths connected in parallel between node 2 and the gate electrode of P8. N7 and P7 are shown with arrowheads on both source and drains to indicate that they conduct bidirectionally. $V_{DD}$ volts are applied to the gate of N7 and ground potential is applied to the gate electrode of P7. N7 and P7 are selected to be small devices having a relatively high impedance such that in combination with the capacitance C7 and other distributed capacitance there will be a delay between the occurrence of a signal at node 2 and the application of that signal to the gate electrode of P8. Clamp circuit 19 includes transistor P8 having its source-to-drain path connected between $V_{DD}$ and node 25. When transistor P8 is turned-on it clamps node 25 to, or close to, $V_{DD}$ volts causing the turn-off of P3 and P4. Thus, whenever P8 is turned-on, the current source is inhibited regardless of whether PC is high or low.

To better understand the timing sequence of the precharge pulse and the address inputs and some aspects of the operation of the circuit of FIG. 1 reference is now made to FIG. 2 which shows part of a typical memory system. The address inputs AIi to the memory system are applied to transition detectors 31 and to buffers 37. The outputs of the transition detectors are applied to a parallel OR network 33 which is connected to a pulse forming precharge network 35 which may be controlled by a signal CS. When network 35 is set to an operating mode by means of a control signal CS, a precharge pulse (PC) of predetermined width will be produced whenever any of the address inputs undergo (or have undergone) a transition. When one or more of the address inputs undergo a transition, a new word or bit line has to be energized ("selected") and a previously energized word or bit line has to be "deenergized" or "deselected". The address input AIi are also applied to buffer circuits 37 which function to produce the signals and their complements ($\overline{AIi}$). The outputs of the buffers are then applied to the different decoding gates (of the type shown in FIG. 1) in section 39. Corresponding to m inputs there may be $2^m$ decoding gates in section 39, with each decoding gate having an output connected directly or indirectly to a word or to a bit line of a memory array 41. In the discussion of the operation of FIG. 1 to follow, it is assumed that the PC pulse is a positive going pulse of given width generated by network 35 whenever any AIi address input undergoes a transition. Also, the PC pulse occurs at the time or just prior to the time, that the new addresses processed by the buffers are applied to the decoding gates. The transition detectors respond very quickly. Accordingly, a signal (PC) indicative of the occurrence of a transition can be generated via circuits 31, 33 and 35, as fast as, if not faster than the generation of the signal and their complements in buffer 37. It is also assumed that the width of the PC pulse is sufficiently long to allow the addresses to stabilize to their new levels. Basic to the design of the circuit is that the output of the decoder (e.g. node 2), gets coupled directly or indirectly to a word line or a bit line of the memory array 41. For the "select" condition when all the Ai inputs are low, a word (or bit) line is going to be selected and information will be read-out from or written into, a certain bit location. When any of the Ai inputs to a decoder gate is high, the word (or bit) line corresponding to that decoder gate will be deselected. Information will then not be read-out from, or written into, the corresponding bit location. For proper operation of the memory array, the deselect, as well as the select have to be very fast. It will now be shown that in the circuit of FIG. 1, V1 and V2 can switch very quickly from the high to the low level and from the low to the high level.

Assume an initial condition where PC is low. Since PC is low, N2 is off and P2 is on. Since P2 is ON and N2 is OFF, the relatively constant current source is turned-off and no current is supplied to node 1. Assume also that one or more of the Ai inputs is high. For this condition, one or more of the NDi transistors is turned-on, the voltage, V1, at node 1 is low and the voltage V2, at node 2 is high. Since V2 is high, the voltage applied to the gate of P8 is also high and P8 is turned-off. A feature of this circuit is that no static current flows and no power is dissipated when PC is low. With PC low N2, P3 and P4 are OFF and P6 and P8 are also OFF.

Assume now that PC goes "high" while one or more Ai input is high. With PC high, P2 is turned-off and N2 is turned-on. P3 and P4 conduct and a current I4 flows into node 1. Before the turn on of P4, node 1 was at, or very close to, zero volts. When P4 turns on (with one or more NDi transistor turned-on) the voltage at node 1 rises by some small amount. The slightly above ground voltage level at node 1 however, is definitely below the threshold point (e.g. 1 volt) at which I5 changes state. Thus, as long as one or more of the NDi transistors is turned-on, PC can go high and P4 can be turned-on, but the voltage at V1 remains in the logic "low" condition and there is no change in V2 which remains "high". Thus, P8 remains turned-off and there is no inhibit applied to the current source (P3, P4).

Assume now that PC is, or goes, high and that all the Ai inputs are low so that all the NDi transistors are turned-off. For this condition, P4 conducts until node 1 is charged up to $V_{DD}$. When all the NDi transistors are turned-off, node 1 is very quickly charged to, or close to, $V_{DD}$ volts since there is then no low impedance path between node 1 and ground. The transition at node 1 from ground to $V_{DD}$ volts is very rapid due to the constant current conduction through P4. As node 1 goes high, the output of I5 (node 2) goes from high to low. The high to low transition at node 2 is coupled via the delay network 17 to the gate electrode of P8. The delay ensures that node 1 is driven high (to $V_{DD}$ volts) before P8 is turned-on. When P8 turns on, it clamps the gates of P3 and P4 sufficiently close to $V_{DD}$ volts to turn off P3 and P4 or to greatly reduce conduction through P3 and P4. P8 is designed to be a relatively large device, and when turned-on it conducts in the common source mode and supplies all, or most, of the current drawn by transistor N2. Thus, when P8 turns on it prevents or inhibits significant current flow through P3 and P4, even though the "high" precharge pulse is still present. When the output of I5 goes low, transistor P6 is turned-on. P6 has a very high ON impedance and the effect of P6 is negligible during the period of time that P4 is on. However, after P4 is turned-off and/or the PC pulse is removed, P6 functions to supply sufficient current to node 1 to offset leakage currents and to maintain node 1 at $V_{DD}$ volts.

It has thus been shown that the circuit can go very quickly from the deselected (one or more Ai input high) to the selected (all Ai inputs low) condition and that the outputs V1 and V2 quickly reach their stable condition.

When the circuit is in the "selected" state as noted above, V1 is high, V2 is low, P8 is turned-on and inhibits the current source (transistors P3 and P4 are held off). Again, as long as PC is low no quiescent current flows in the circuit and there is no quiescent power dissipation. With PC low, N2, P3 and P4 are OFF, P6 is ON but since node 1 is at $V_{DD}$ no current flows (except for leakage), and P8 is also ON but no current flows. If a "high" PC pulse is applied while the circuit is "selected" (i.e. when all the Ai inputs remain low and all the NDi transistors are OFF) there is no change at node 1 and 2. With PC high, N2 is turned-on; but, its source-to-drain current is being supplied by P8 since V2 is low. Thus, although a precharge pulse is applied the current source remains inhibited and non-conducting.

It will now be shown that the circuit can go quickly from a "selected" state to a "deselected" state even while a high PC pulse is being applied. When the circuit is deselected, one or more, of the Ai inputs goes high and at least one of the parallel decoding transistors NDi is turned-on. Recall that the circuit was previously "selected", that V2 is low and that P8 is turned-on holding P3 and P4 off. Thus, although PC is "high" and N2 is turned-on, P4 cannot supply any current (other than leakage) to node 1, and P6 although ON has a very high impedance and can be neglected. Thus, as soon as an NDi transistor is turned-on, node 1 will be pulled towards ground potential via the conduction path of the turned-on NDi transistor. In fact, node 1 will be clamped to ground potential very quickly since the ON impedance of the NDi transistors is very much less than the ON impedance of P6, and the capacitance associated with the node can be quickly discharged. When node 1 goes low the output of I5 goes from low to high. However, there is a delay before the low to high transition at the output of I5 is applied to P8. Due to the delay, P8 is not immediately turned-off and the current source remains inhibited. The delay ensures that node 1 is pulled all the way down to ground via a turned-on NDi transistor before P8 can be turned-off. A very firm level is therefore established at node 1 and at node 2. This is extremely important since it enables the certain and rapid propagation of the deselect condition to the previously selected word line coupled to node 2.

After the delay, P8 is turned-off due to the fact that V2 is high and if a precharge pulse is present the relatively constant current source transistor P4 is turned-on and supplies a current I4 into node 1. This current has the effect of raising the potential at node 1. But, the ratio of P4, conducting as a current source, versus the clamped NDi transistor is set so that node 1 remains well below the threshold voltage of inverter I5. Thus, as discussed above, node 1 remains at the "low" level.

Clearly, once "deselected", V1 remains low, V2 is high, P8 is turned-off removing the current source inhibit, and the current source (P4) is enabled whenever a high PC pulse is present. It has thus been shown that the circuit of FIG. 1 can go very quickly from a deselect to a select condition or from a select to deselect condition.

In the circuit of FIG. 1 the means for charging node 1 to $V_{DD}$ is a controllable relatively constant current source. This has many advantages since the current source is more easily controlled, particularly since the current produced by P4 is a function of the current through N2, and N2 is of the same conductivity type as the NDi transistors. However, it should be evident that the relatively constant current source sould be replaced by a controllable impedance driven to a low value by a precharge (or other control) signal and turned-off or driven to a very high value in response to the appropriate voltage conditions at nodes 1 and/or 2.

Although the invention has been described and discussed in terms of a decoding gate, the invention may be used as part of a logic circuit or to form a logic circuit (such as AND gate, OR gates or combinations thereof) used to indicate the coincidence or lack of coincidence of two or more signals.

The invention has been shown with a precharging signal, PC, applied to the input of inverter I2 and a feedback signal (V2) derived from the summing node applied to the clamping transistor P8. It should be appreciated that a signal derived from the summing node could be coupled to the input of the inverter I2 to control the turn-on and turn-off of the relatively constant current source P3-P4, and that the percharge signal (PC) could be applied to the clamp transistor P8 to control its turn-on and turn-off.

What is claimed is:
1. The combination comprising:
a plurality of input signal transistors having their conduction paths connected in parallel between a summing node and a circuit point at a first potential, each one of said transistors when turned-on tending to clamp said summing node to said first potential;
a controllable load means connected between said summing node and a second circuit point at a second potential for providing a conduction path for charging said summing node towards said second potential when enabled and in the absence of an inhibit signal;
inhibit means, coupled between said summing node and said controllable load means, responsive to the voltage at said summing node for applying an inhibit signal to said controllable means and preventing conduction via said charging conduction path when the potential at said summing node is approximately equal to said second potential; and means for applying a control signal to said controllable load means for selectively enabling said controllable load means.

2. The combination as claimed in claim 1 wherein said inhibit means includes means for:

(a) delaying for a first period of time the application of said inhibit signal to said controllable load means, the first period of time being sufficient to enable the potential at said summing node to become approximately equal to said second potential; and (b) delaying for a second period of time the removal of said inhibit signal applied to said controllable load means, the second period of time being sufficient to enable the potential at said summing node to become approximately equal to said first potential.

3. The combination as claimed in claim 2 wherein said controllable load means includes a relatively constant current source.

4. The combination as claimed in claim 3 wherein said inhibit means including said delaying means includes:

(a) a clamping transistor coupled to said current source for, when turned-on, disabling said current source;

(b) an inverter connected at its input to said summing node and at its output to an output node; and (c) a delay network connected between said output node and said clamping transistor.

5. The combination as claimed in claim 4 wherein said controllable load means including said relatively constant current source includes:

(a) an input control inverter connected at its input to said means for applying a control signal to said controllable load means; and (b) first and second transistors connected at their source electrodes to said second circuit point, the gate and drain of said first transistor and the gate of said second transistor being connected to the output of said input control inverter, and the drain of said second transistor being connected to said summing node.

6. The combination as claimed in claim 1 further including means applying address inputs to said input signal responsive transistors; and further including:

a memory array having a word line and a bit line; and means responsive to the voltage at said summing node for applying a voltage corresponding to the summing node voltage to one of said word and bit line.

7. A decoding gate comprising:

a plurality of input signal transistors having their conduction paths connected in parallel between a summing node and a first point of first potential, each one of said transistors, when turned-on, tending to clamp said summing node to said first potential;

a load transistor having a conduction path and a control electrode, means connecting the conduction path of said load transistor between a second circuit point and said summing node;

inhibit means coupled between said summing node and the control electrode of said load transistor for maintaining it turned-off and inhibiting conduction therethrough when the potential at said summing node is approximately equal to the potential at said second circuit point;

a control signal input terminal; and means coupled between said control signal input terminal and to the gate electrode of said load transistor for turning-on said load transistor in response to the application of a turn on control signal to said control signal input terminal in the absence of an inhibit signal.

8. The combination as claimed in claim 7 further including means applying address inputs to said input signal transistors, including means for applying said turn on control signal concurrently with the generation of a change in the address inputs to said input signal transistors.

9. The combination comprising:

a plurality of input signal transistors, each transistor having a control electrode and a conduction path, means connecting the conduction paths of said plurality of input signal transistors in parallel between a summing node and a circuit point at a first potential, and means connecting the control electrode of each one of said input signal transistor to a different one of a plurality of input lines;

a controllable load means connected between said summing node and a second circuit point at a second potential, said controllable load means being responsive to an externally applied control signal and to a feedback signal derived from said summing node for providing a conduction path charging said summing node to said second potential when said control signal is in an enabling condition and when the potential at said summing node is either approximately equal to the potential at said first point potential or when the potential at said summing node making transition from said first to said second potential.

* * * * *